United States Patent
Wu et al.

(10) Patent No.: US 10,411,165 B2
(45) Date of Patent: Sep. 10, 2019

(54) INVISIBLE-LIGHT LIGHT EMITTING DIODE AND FABRICATION METHOD THEREOF

(71) Applicant: XIAMEN SAN'AN OPTOELECTRONICS CO., LTD., Xiamen (CN)

(72) Inventors: Chaoyu Wu, Xiamen (CN); Chun-Yi Wu, Xiamen (CN); Chun Kai Huang, Xiamen (CN); Duxiang Wang, Xiamen (CN)

(73) Assignee: XIAMEN SAN'AN OPTOELECTRONICS CO., LTD., Xiamen (CN)

(*) Notice: Subject to any disclaimer, the term of this patent is extended or adjusted under 35 U.S.C. 154(b) by 0 days.

(21) Appl. No.: 15/870,729

(22) Filed: Jan. 12, 2018

(65) Prior Publication Data
US 2018/0138371 A1 May 17, 2018

Related U.S. Application Data

(63) Continuation of application No. PCT/CN2017/085658, filed on May 24, 2017.

(30) Foreign Application Priority Data

Jun. 1, 2016 (CN) .......................... 2016 1 0381153

(51) Int. Cl.
| | |
|---|---|
| H01L 33/00 | (2010.01) |
| H01L 33/44 | (2010.01) |
| H01L 33/04 | (2010.01) |
| H01L 33/30 | (2010.01) |

(52) U.S. Cl.
CPC ............ *H01L 33/44* (2013.01); *H01L 33/005* (2013.01); *H01L 33/04* (2013.01); *H01L 33/30* (2013.01)

(58) Field of Classification Search
CPC ............ H01L 33/0062; H01L 33/0066; H01L 33/00–648; H01L 27/15–156
See application file for complete search history.

(56) References Cited

U.S. PATENT DOCUMENTS

| | | | | |
|---|---|---|---|---|
| 7,880,187 B2 * | 2/2011 | Sasakura | ................. | H01L 33/02 257/101 |
| 2014/0027809 A1 * | 1/2014 | Taniguchi | ................. | H01S 5/22 257/99 |

FOREIGN PATENT DOCUMENTS

CN          1758457 A          4/2006

* cited by examiner

*Primary Examiner* — Shaun M Campbell
*Assistant Examiner* — Suberr L Chi
(74) *Attorney, Agent, or Firm* — Syncoda LLC; Feng Ma

(57) ABSTRACT

An invisible-light light-emitting diode includes an N-type ohmic contact semiconductor layer, an N-type current spreading layer, an N—GaAs visible-light absorption layer, an N-type cladding layer, a light-emitting layer, a P-type cladding layer and a P-type ohmic contact semiconductor layer. In the invisible-light light-emitting diode, the absorption layer is GaAs, which can effectively remove all visible light when current density is >1 A/mm$^2$, and essentially all visible light when current density is below 3 A/mm$^2$. This effectively solves the red dot effect of invisible-light light-emitting diodes.

20 Claims, 6 Drawing Sheets

INVISIBLE-LIGHT LIGHT EMITTING DIODE AND FABRICATION METHOD THEREOF

CROSS-REFERENCE TO RELATED APPLICATIONS

The present application is a continuation of, and claims priority to, PCT/CN2017/085658 filed on May 24, 2017, which claims priority to Chinese Patent Application No. 201610381153.4 filed on Jun. 1, 2016. The disclosures of these applications are hereby incorporated by reference in their entirety.

BACKGROUND

Today, red dot effect is common in existing invisible-light light-emitting diode chips: during visual observation of chip lighting, it can be seen that some dark red light is emitted from the chip when it is lighted on. This restricts the needs for pure infrared light free of red dots in application. Therefore, it is necessary to provide an invisible-light chip free of visible light in the market.

Referring to Chinese patent No. CN1758457A for an example, a conventional infrared light-emitting diode is disclosed. In this structure, the light absorption layer has a band gap wider than the band gap of the active layer. It is therefore possible to reduce red light components by absorbing the components at the skirt on the shorter wavelength side of the radiation spectrum.

SUMMARY

The inventors of the present disclosure have recognized that, the conventional structure can have problems such as that: required thickness of the light absorption layer is above 0.1 μm, yet over-thickness may cause serious light absorption and sharply reduce light power. In addition, this structure cannot be used for fabricating high-brightness chips, and thereby fails to meet market requirements for security and protection systems.

To solve the aforementioned problems, the present disclosure provides an invisible-light light-emitting diode and fabrication method thereof. With a combination of epitaxial structure and chip process, a high-brightness invisible-light light-emitting diode with no red dots is therefore fabricated to meet application requirements of this field.

According to a first aspect of the present disclosure, the technical scheme to solve the above problems is provided in an invisible-light light-emitting diode, which includes a current spreading layer, a GaAs visible-light absorption layer, a first-type cladding layer, a light-emitting layer and a second-type cladding layer, wherein, when input current density of the light-emitting layer is $\geq 1$ A/mm$^2$, visible light ratio of the light-emitting diode is <0.2%.

In some embodiments, the band gap difference between the GaAs visible-light absorption layer and the light-emitting layer is 0.13 eV.

In some embodiments, doping concentration of the GaAs visible-light absorption layer is <7E17.

In some embodiments, thickness of the GaAs visible-light absorption layer is below 100 nm.

In some embodiments, the GaAs visible-light absorption layer is 20-70 nm thick.

In some embodiments, the current spreading layer is AlGaAs, wherein, ratio of Al/Ga component is >0.3.

In some embodiments, doping concentration of the current spreading layer is <7E17.

In some embodiments, the first-type cladding layer includes a first cladding layer $Al_xGa_{1-x}As$ and a second cladding layer $Al_yGa_{1-y}As$, where Y>X. As component energy level of the first cladding layer and the second cladding layer changes, energy level barriers of electrons and holes in the interface between the cladding layer and the visible-light absorption layer can be reduced. Preferably, Al component X of the first cladding layer is 15% with doping concentration of 6 E17; and Al component X of the first cladding layer is 35% with a doping concentration of 1 E18.

According to the second aspect of the present disclosure, a fabrication method for an epitaxial wafer of invisible-light light-emitting diode is provided, where a current spreading layer, a GaAs visible-light absorption layer, a first-type cladding layer, a light-emitting layer and a second-type cladding layer are formed in successive. When input current density of the light-emitting layer is $\geq 1$ A/mm$^2$, visible light ratio of the light-emitting diode is <0.2%.

In some embodiments in the present disclosure, a flip-chip vertical invisible-light light-emitting diode is fabricated by: 1) Epitaxial growth: growing an N-type ohmic contact semiconductor layer, an N-type current spreading layer, an N—GaAs visible-light absorption layer, an N-type cladding layer, a light-emitting layer, a P-type cladding layer and a P-type ohmic contact semiconductor layer in successive over the growth substrate; 2) Substrate transfer: connecting a conductive substrate over the P-type ohmic contact semiconductor layer, and remove the growth substrate to expose the N-type ohmic contact semiconductor layer; 3) Electrode fabrication: fabricating an N electrode over the N-type ohmic contact semiconductor layer.

According to a third aspect of the present disclosure, an invisible-light light-emitting system, including a plurality of invisible-light light-emitting diode, is provided. Each invisible-light light-emitting diode includes: a current spreading layer, a GaAs visible-light absorption layer, a first-type cladding layer, a light-emitting layer, and a second-type cladding layer; wherein, when input current density of the light-emitting layer is $\geq 1$ A/mm$^2$, visible light ratio of the light-emitting diode is <0.2%.

In the invisible-light light-emitting diode according to some embodiments of the present disclosure, the absorption layer is GaAs, which can effectively remove all visible light when current density is >1 A/mm$^2$, in particular, basically all visible light when current density is below 3 A/mm$^2$. This effectively solves the red dot effect of invisible-light light-emitting diodes.

The other features and advantages of this present disclosure will be described in detail in the following specification, and it is believed that such features and advantages will become more obvious in the specification or through implementations of this disclosure. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

DETAILED DESCRIPTION

The embodiments of the present disclosure will be described in detail with reference to the accompanying drawings and examples, to help understand and practice the disclosed embodiments, regarding how to solve technical problems using technical approaches for achieving the technical effects.

It should be understood that the embodiments and their characteristics described in this disclosure may be combined with each other and such technical proposals are deemed to be within the scope of this disclosure without departing from the spirit of this disclosure.

According to the present disclosure, the first-type cladding layer and the second-type cladding layer are inversed to each other. For example, first-type cladding layer is N-type, the second-type cladding layer is P-type; if the first-type cladding layer is P-type, the second-type cladding layer is N-type.

Embodiment 1

Figure 1:
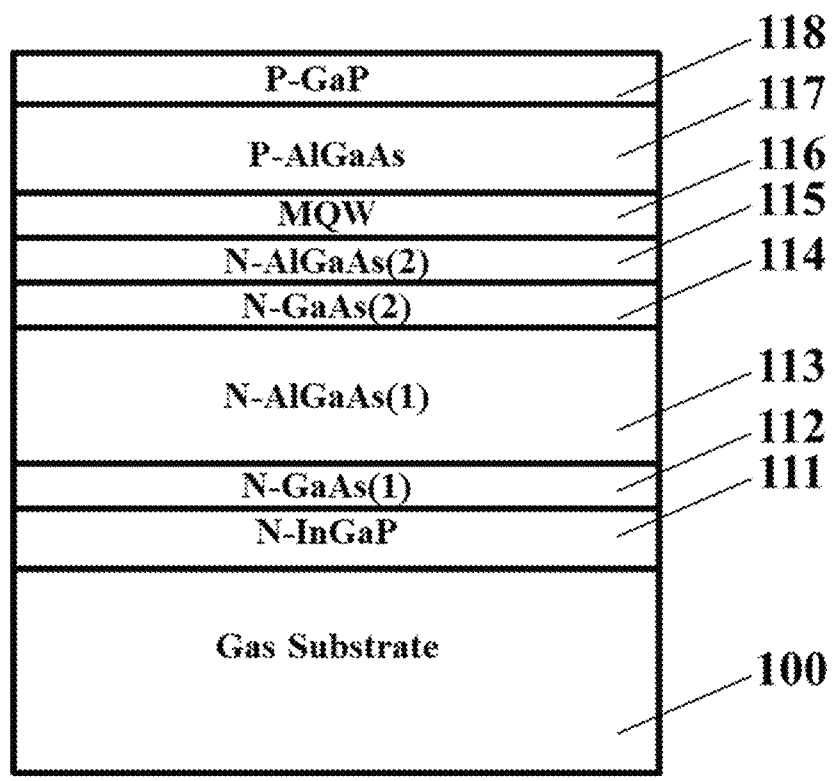
FIG. 1 illustrates a sectional view of an epitaxial structure of an invisible-light LED according to some embodiments in the present disclosure.

With reference to FIG. 1, an epitaxial structure of a light-emitting diode, according to the present disclosure, includes a growth substrate 100, an etching stop layer 111, an N-type ohmic contact layer 112, an N-type current spreading layer 113, an N—GaAs visible-light absorption layer 114, an N-type cladding layer 115, a light-emitting layer 116, a P-type cladding layer 117 and a P-type ohmic contact layer 118.

Specifically, the growth substrate 100 is GaAs; the etching stop layer 111 is N—InGaP; the N-type ohmic contact layer 112 is GaAs; the N-type current spreading layer 113 is n-AlGaAs with doping concentration of at least above 7E17, and preferred value of 1E18; the doping material can be Si or Te with thickness of at least 1 μm, and preferred value of 7 μm; the N—GaAs visible-light absorption layer 114 is Si-doped with doping concentration less than 7E17, wherein, maximum thickness is less than 100 nm, preferred thickness is 20-70 nm, and optimal thickness is 50 nm; the N-type cladding layer 114 is Si-doped $Al_xGa_{1-x}As$, wherein, X is 10%-45%, and a preferred X is 35%; concentration is 5E17-2E18, and preferred concentration is 1E18; the light-emitting layer 116 is a non-doped multiple-quantum well structure, wherein, the well layer is InGaAs material with thickness of 3-80 nm and preferred thickness of 8 nm; the barrier layer is AlGaAsP with thickness of 5-90 nm and preferred thickness of 25 nm; number of quantum well pairs is between 3-25, and preferred number of pairs is 12; the p-type cladding layer 117 is C-doped $Al_xGa_{1-x}As$, wherein, X is 5%-40% and preferred X is 35%; concentration is 8E17-6E18 and preferred concentration is 1E18; the P-type ohmic contact layer 118 is p-GaP, wherein, doping concentration is above 8E17, and preferred value is 1E18; and doping material can be Mg, Zn or C.

Detailed description will be given below for the high-brightness invisible-light LED chip in various embodiments of the present disclosure in combination with the fabrication method.

First, forming an epitaxial structure as shown in FIG. 1 via epitaxial structure.

Figure 2:
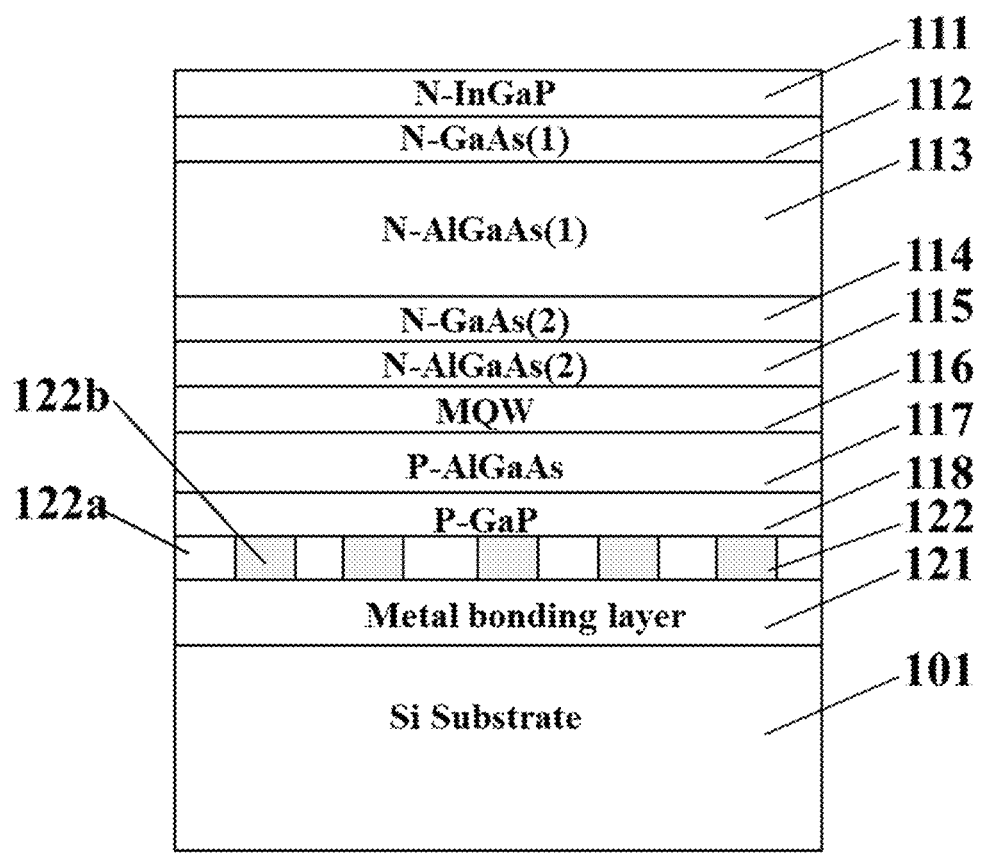
FIG. 2 illustrates a sectional view for the fabrication process of an invisible-light LED according to some embodiments of the present disclosure.

Next, transfer the substrate: fabricating a mirror layer 122 over the surface of the P-type ohmic contact layer 118. The mirror layer 122 includes a P-type ohmic contact metal layer 122a and a high-transparent dielectric material layer 122b. This combination, on the one hand, provides a P-type ohmic contact layer; and on the other hand, reflects the light that is emitted downwards from the light-emitting layer; providing a conductive substrate 101 coving with a metal bonding layer 121; binding the conductive substrate 101 with the mirror layer 122; and removing the growth substrate 100 to expose the N-side surface of the semiconductor epitaxial laminated layer, as shown in FIG. 2.

Next, fabricate an electrode: removing the etching stop layer 111 with hydrochloric acid and phosphoric acid; and fabricating an N-type ohmic contact electrode 131 and a P electrode 132 via yellow light, wet chemical processing and metal evaporation process.

Figure 3:
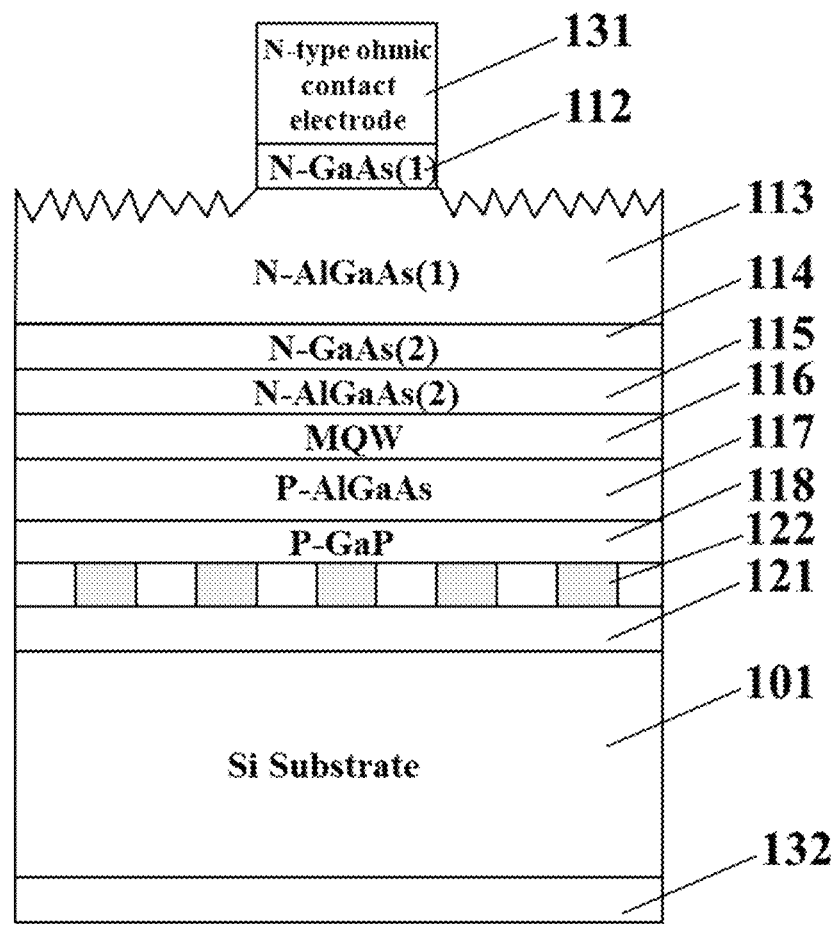
FIG. 3 illustrates a sectional view of an invisible-light LED chip structure fabricated as the epitaxial structure as shown in FIG. 1.

Finally, fabricate a light-extraction structure: roughening the surface of the N-type current spreading layer 113 with mixture of nitric acid, acetic acid and water, as shown in FIG. 3.

The Table 1 below lists main materials of each layer in the LED epitaxial structure as shown in FIG. 1 and preferred values of related parameters.

TABLE 1

| Function | Layer | Material | Thickness (nm) | Doping concentration | Band gap | Al/(Al + Ga) |
|---|---|---|---|---|---|---|
| N-type ohmic contact semiconductor layer | N—GaAs(1) | GaAs: Si | 60 | 1.00E18 | 1.42 | 0% |
| Current spreading layer | N—AlGaAs(1) | $Al_{0.16}Ga_{0.84}As$: Si | 7000 | 5.00E17 | 1.63 | 16% |
| Visible-light absorption layer | N—GaAs(2) | GaAs: Si | 50 | 5.00E17 | 1.42 | 0% |
| N-type cladding layer | N—AlGaAs(2) | $Al_{0.36}Ga_{0.64}As$: Si | 400 | 1.00E18 | 1.88 | 36% |
| Barrier layer of light emitting layer | MQW | $Al_{0.1}G_{0.9}AsP$ | 25 | — | ~1.6 | 10% |
| Well layer of light emitting layer | | $In_{0.07}Ga_{0.93}As$ | 8 | — | 1.29 | 0% |

TABLE 1-continued

| Function | Layer | Material | Thickness (nm) | Doping concentration | Band gap | Al/(Al + Ga) |
|---|---|---|---|---|---|---|
| P-type cladding layer | P—AlGaAs | $Al_{0.36}Ga_{0.64}As$: C | 2800 | 1.00E18 | 1.88 | 36% |
| P-type ohmic contact semiconductor layer | P—GaP | GaP: C | 50 | 3.00E18 | 2.26 | 0% |

In the invisible-light LED chip fabricated by above materials and related parameters, band gap difference between the light absorption layer and the light-emitting layer is 0.13 eV. Therefore, the light absorption layer absorbs less luminance, which effectively improves low light power resulting from elimination of red dot effect.

Figure 4:
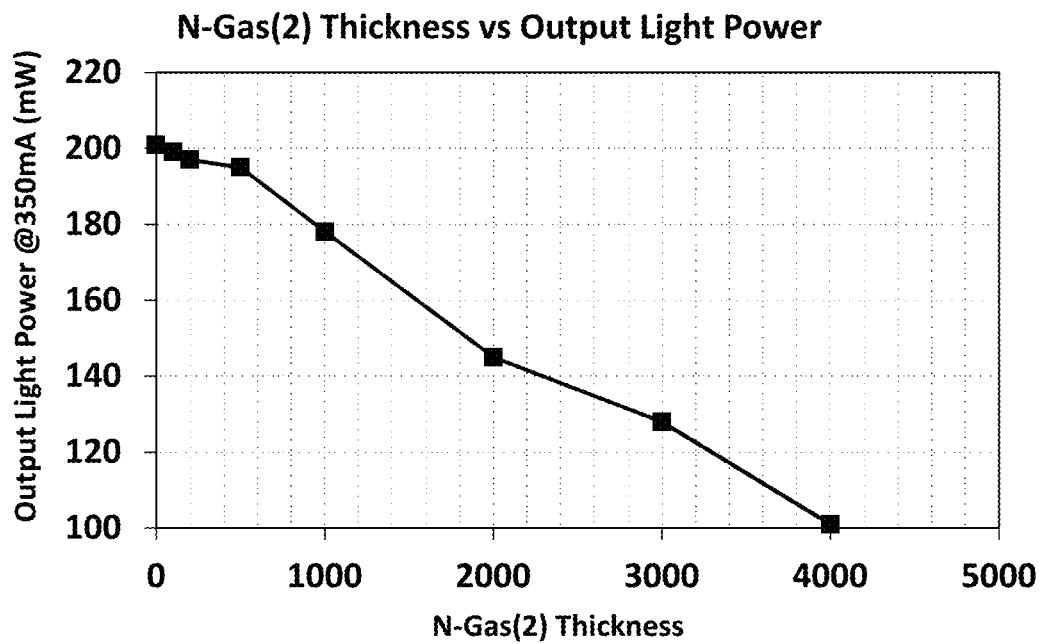
FIG. 4 shows the relationship between thickness of the N—GaAs visible-light absorption layer in the LED chip as shown in FIG. 3 and output light power of the device.
Figure 5:
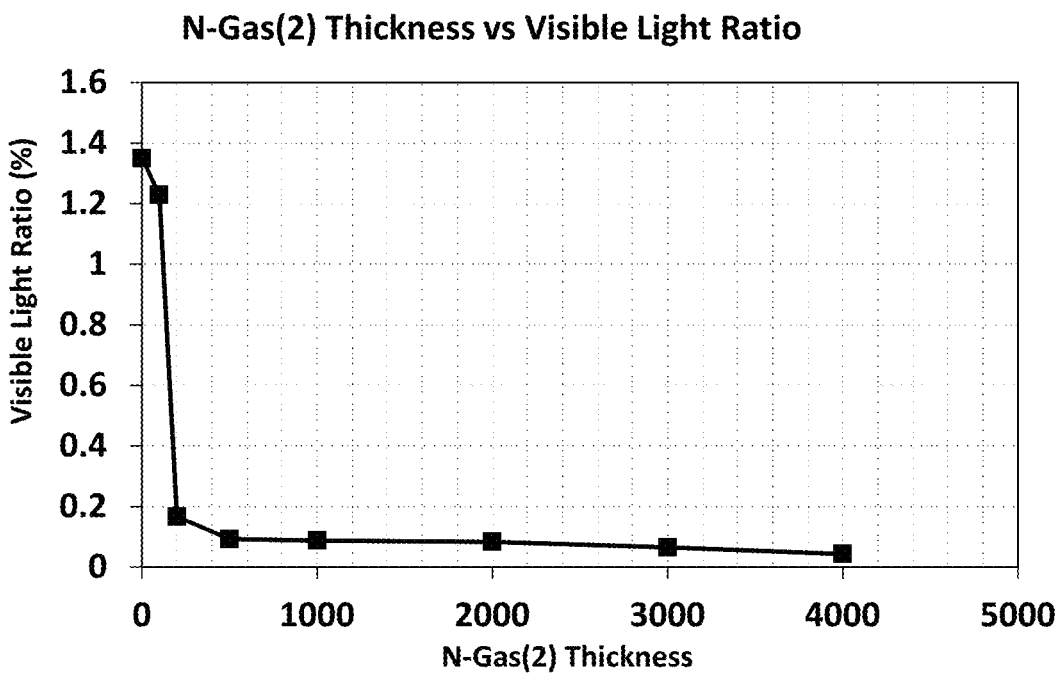
FIG. 5 shows the relationship between thickness of the N—GaAs visible-light absorption layer in the LED chip as shown in FIG. 3 and output visible light ratio of the device.

FIGS. 4 and 5 show the relationship diagrams between the thickness of the N—GaAs visible-light absorption layer of an invisible-light light-emitting diode as shown in FIG. 3 and the output light power of the device as well as the visible light ratio. As shown in the FIG. 5, when thickness of the N—GaAs visible-light absorption layer is above 20 nm, visible light ratio can be lowered to below 0.2%; further, when output light power has little influence and visible light ratio is <0.1%, preferred thickness is 50 nm and maximum thickness is 100 nm.

Figure 6:
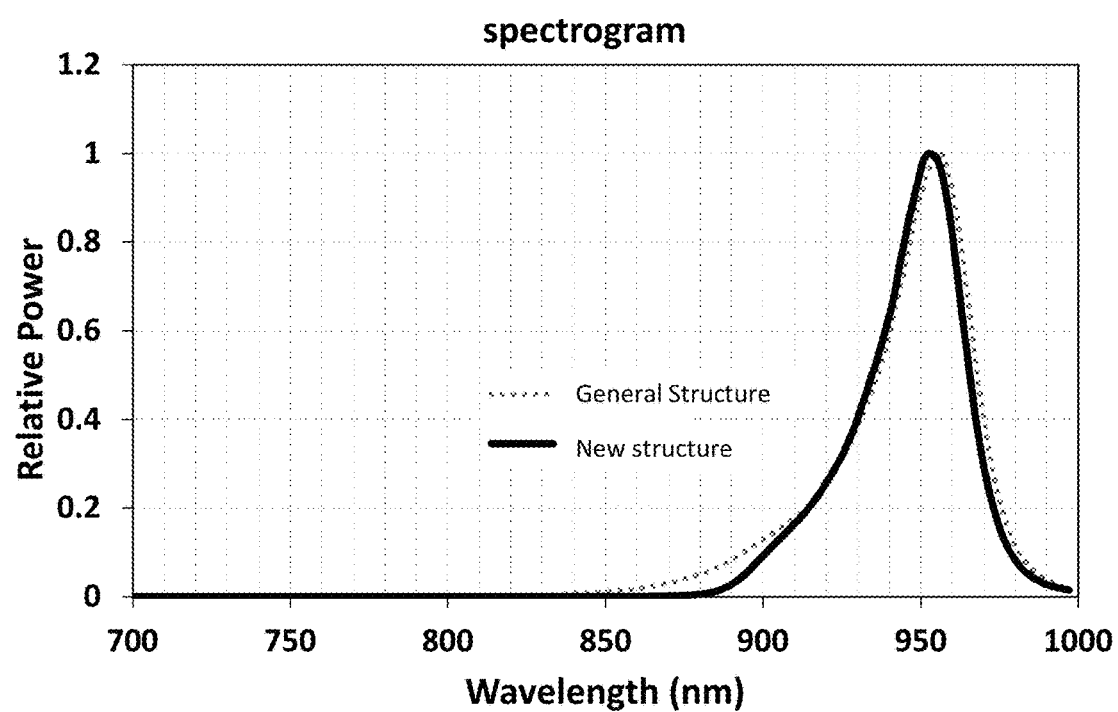
FIG. 6 shows spectrograms of the LED chip as shown in FIG. 3 and a conventional invisible-light LED chip.

Referring to FIG. 6, as shown in spectrograms of two different structures, in the light-emitting diode (i.e., the new structure) as shown in FIG. 3, visible light portion is effectively removed as it is absorbed by the N—GaAs visible-light absorption layer, to thereby fabricate an invisible-light chip without red dots.

Embodiment 2

Figure 7:
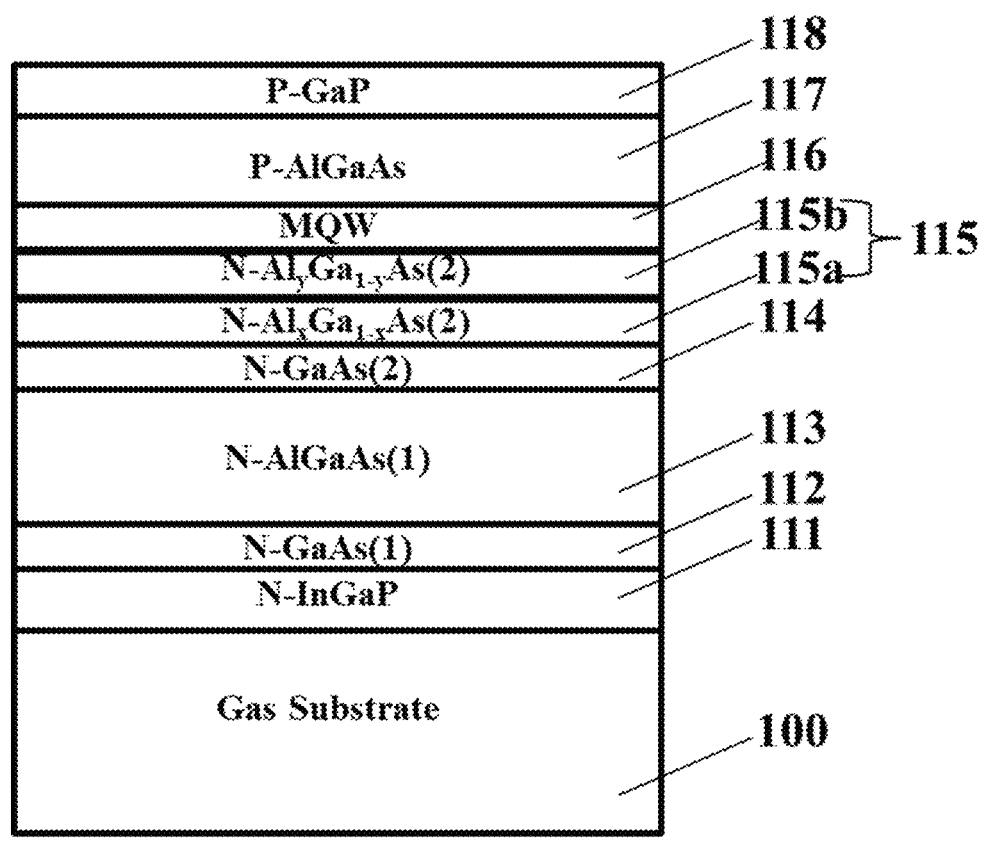
FIG. 7 illustrates a sectional view of another invisible-light light-emitting diode structure according to some embodiments of the present disclosure.

Referring to FIG. 7, in this embodiment, the N-type cladding layer 115 is composed of a first cladding layer 115a and a second cladding layer 115b. As component energy level of the first and the second cladding layers changes, energy level barriers of electrons in the interface between the cladding layer and the visible-light absorption layer are reduced, thus obtaining low voltage value. Preferably, Al component X of the first cladding layer $Al_XGa_{1-X}As$ is 15% with doping concentration of 6E17; and Al component X of the first cladding layer $Al_YGa_{1-Y}As$ is 35% with doping concentration of 1E18.

In the examples of above embodiments, the first-type cladding layer is an N-type cladding layer, and the second-type cladding layer is a P-type cladding layer. It should be noted that, the present disclosure also applies to the light-emitting diode structure where the first-type cladding layer is a P-type semiconductor layer, in which case, the current spreading layer, the GaAs visible-light absorption layer and other material layers are correspondingly P-doped.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An invisible-light light-emitting diode, comprising:
    a current spreading layer;
    a GaAs visible-light absorption layer;
    a first-type cladding layer;
    a light-emitting layer; and
    a second-type cladding layer;
    wherein the first-type cladding layer comprises a first cladding layer and a second cladding layer with a component energy level variation such that energy level barriers of electrons at an interface between the first-type cladding layer and the GaAs visible-light absorption layer are reduced to an extent that, when input current density of the light-emitting layer is $\geq 1 A/mm^2$, visible light ratio of the light-emitting diode is <0.2%.

2. The invisible-light light-emitting diode of claim 1, wherein the band gap difference between the GaAs visible-light absorption layer and the light-emitting layer is 0.13 eV.

3. The invisible-light light-emitting diode of claim 1, wherein a doping concentration of the GaAs visible-light absorption layer is <7E17.

4. The invisible-light light-emitting diode of claim 1, wherein a thickness of the GaAs visible-light absorption layer is below 100 nm.

5. The invisible-light light-emitting diode of claim 1, wherein the GaAs visible-light absorption layer is 20-70 nm thick.

6. The invisible-light light-emitting diode of claim 1, wherein the current spreading layer is N—AlGaAs, and a ratio of Al/Ga component is >0.3.

7. The invisible-light light-emitting diode of claim 1, wherein a doping concentration of the current spreading layer is <7E17.

8. The invisible-light light-emitting diode of claim 1, wherein the first cladding layer is an $Al_XGa_{1-X}As$ layer, and the second cladding layer is an $Al_YGa_{1-Y}As$ layer, where Y>X.

9. The invisible-light light-emitting diode of claim 8, wherein an Al component X of the first cladding layer is 15% with a doping concentration of 6E17.

10. The invisible-light light-emitting diode of claim 8, wherein an Al component Y of the second cladding layer is 35% with a doping concentration of 1E18.

11. A fabrication method for an invisible-light light-emitting diode according to claim 1, the method comprising:
    forming a current spreading layer, a GaAs visible-light absorption layer, a first-type cladding layer, a light-emitting layer and a second-type cladding layer in successive;
    wherein when input current density of the light-emitting layer is $\geq 1 A/mm^2$, visible light ratio of the light-emitting diode is <0.2%.

12. The fabrication method of claim 11, further comprising:
    1) Epitaxial growth: growing a current spreading layer, a GaAs visible-light absorption layer, a first-type cladding layer, a light-emitting layer and a second-type cladding layer over the growth substrate in successive;

2) Substrate transfer: connecting a conductive substrate over the second-type cladding layer, and remove the growth substrate; and 3) Electrode fabrication: fabricating an N electrode over the current spreading layer.

13. An invisible-light light-emitting system including a plurality of invisible-light light-emitting diodes according to claim 1.

14. The invisible-light light-emitting system of claim 13, wherein the band gap difference between the GaAs visible-light absorption layer and the light-emitting layer is 0.13 eV.

15. The invisible-light light-emitting system of claim 13, wherein a doping concentration of the GaAs visible-light absorption layer is <7E17.

16. The invisible-light light-emitting system of claim 13, wherein a thickness of the GaAs visible-light absorption layer is below 100 nm.

17. The invisible-light light-emitting system of claim 13, wherein the GaAs visible-light absorption layer is 20-70 nm thick.

18. The invisible-light light-emitting system of claim 13, wherein the current spreading layer is N—AlGaAs, wherein, ratio of Al/Ga component is >0.3.

19. The invisible-light light-emitting system of claim 13, wherein a doping concentration of the current spreading layer is <7E17.

20. The invisible-light light-emitting system of claim 13, wherein the first-type cladding layer comprises a first cladding layer $Al_XGa_{1-X}As$ and a second cladding layer $Al_YGa_{1-Y}As$, where Y>X; as component energy level of the first cladding layer and the second cladding layer changes, energy level barriers of electrons in the interface between the first-type cladding layer and the visible-light absorption layer are reduced.

* * * * *